United States Patent
Yang

(10) Patent No.: US 8,086,416 B2
(45) Date of Patent: Dec. 27, 2011

(54) AUTO-SYNCHRONOUS POWER GAUGE

(75) Inventor: Ken G. C. Yang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1112 days.

(21) Appl. No.: 11/713,415

(22) Filed: Mar. 2, 2007

(65) Prior Publication Data

US 2008/0157720 A1     Jul. 3, 2008

Related U.S. Application Data

(63) Continuation-in-part of application No. 11/649,149, filed on Jan. 3, 2007, now Pat. No. 7,383,139.

(51) Int. Cl.
*H02J 7/00* (2006.01)
(52) U.S. Cl. ......................................................... 702/61
(58) Field of Classification Search ...................... 702/61
See application file for complete search history.

(56) References Cited

U.S. PATENT DOCUMENTS 5,764,035 A * 6/1998 Lee ................................ 320/160
6,785,826 B1 * 8/2004 Durham et al. ............... 713/300

* cited by examiner

*Primary Examiner* — Tung S Lau
(74) *Attorney, Agent, or Firm* — Farjami & Farjami LLP

(57) ABSTRACT

According to one exemplary embodiment, an auto-synchronous power gauge for measuring total charge consumed from a power source of an electronic device includes an analog to digital converter for sampling a signal corresponding to current drawn from the power source, and one or more accumulators. The analog to digital converter produces digital outputs which are received and summed by the one or more accumulators. The auto-synchronous power gauge further includes a power mode detector for generating a power mode signal using the signal corresponding to current drawn from the power source, where the power mode signal is used by a controller to enable and disable the one or more accumulators and the analog to digital converter. The total charge consumed can be determined by a processor coupled to the auto-synchronous power gauge. In one embodiment, a sync signal from the processor provides input to the controller.

12 Claims, 5 Drawing Sheets

US 8,086,416 B2

AUTO-SYNCHRONOUS POWER GAUGE

This application is a continuation in part of, and claims benefit of the filing date of, and hereby incorporates fully by reference, the parent application entitled "Synchronous Power Gauge" Ser. No. 11/649,149, filed Jan. 3, 2007, now U.S. Pat. No. 7,383,139 and assigned to the assignee of the present application.

BACKGROUND OF THE INVENTION

1. Field of the Invention

The present invention is generally in the field of electronics. More particularly, the present invention is in the field of electronic devices relying on battery power.

2. Background

An important feature of an electronic device, such as a cellular telephone, is the accurate determination of the charge remaining in the power source, such as a battery, powering the electronic device. The accurate determination of charge remaining in the power source is critical since such information is typically used by the electronic device to determine a course of action, such as to provide the user with an indication that the power source is low or to disable the electronic device completely by automatically turning it off.

To determine the charge remaining in a power source providing power to an electronic device, such as a battery providing power to a cellular telephone, a "power gauge circuit" (also referred to simply as a "power gauge" in the present application, and sometimes referred to as a "fuel gauge" or "gas gauge" in the industry) can be used to determine the total charge consumed from the power source, which can then be also used to determine the charge remaining in the power source. Such a power gauge circuit typically includes an analog to digital converter which samples a voltage corresponding to the current drawn from the power source by the electronic device. The analog to digital converter provides digital outputs to an accumulator which receives and maintains a sum of the digital outputs. The sum of digital outputs can then be used to determine the total charge consumed from the power source.

However, such a power gauge circuit can consume a substantial amount of power from the power source since, for example, the analog to digital converter and the accumulator in the conventional power gauge circuit must remain continuously on to measure the charges consumed from the power source. Moreover, since the current drawn from an electronic device can vary greatly during its various modes of operation, for example the current can vary from just 1.0 milliamps to over 100.0 milliamps, a very high resolution and complex analog to digital converter is typically required to operate over a very large range of values. Such high resolution analog to digital converters can also disadvantageously consume a substantial amount of power from the power source. Consequently, given the limited capacity of power sources, e.g. batteries, used in portable electronic devices, conventional power gauges present significant shortcomings and disadvantages.

SUMMARY OF THE INVENTION

An auto-synchronous power gauge, substantially as shown in and/or described in connection with at least one of the figures, as set forth more completely in the claims.

DETAILED DESCRIPTION OF THE INVENTION

The present invention is directed to an auto-synchronous power gauge. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
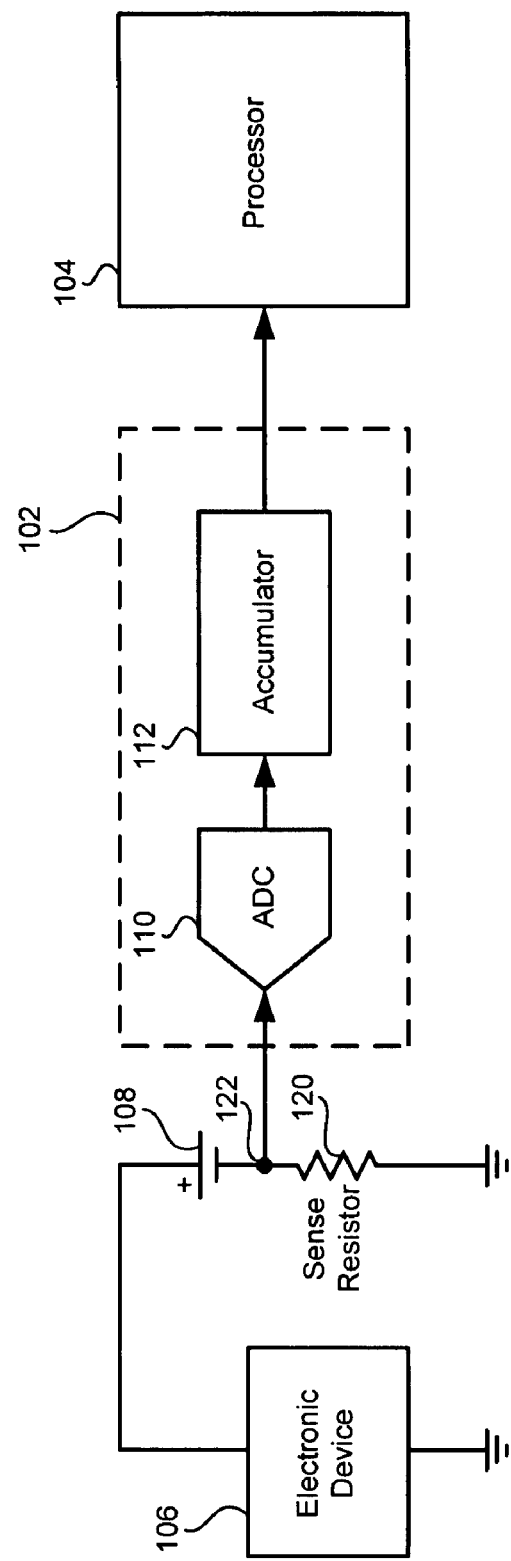
FIG. 1 shows a conventional power gauge.

FIG. 1 illustrates an example of a conventional power gauge. FIG. 1 includes power gauge 102, which includes analog to digital converter ("ADC") 110 and accumulator 112, processor 104, electronic device 106 and power source 108. As shown in FIG. 1, electronic device 106 is coupled to the positive terminal of power source 108. As further shown in FIG. 1, the negative terminal of power source 108 is coupled to the first terminal of sense resistor 120 at node 122. Electronic device 106 can be, for example, a portable electronic device, such as a cellular telephone, a camera, a personal digital assistant, a lap top computer, a portable DVD or MP3 player or any other electronic device. Power source 108 can be a battery, for example.

As electronic device 106 draws current from power source 108, a voltage is generated across sense resistor 120, i.e. at node 122 relative to ground. Analog to digital converter 110 in power gauge 102 can be configured to receive and sample the voltage generated at node 122. As shown in FIG. 1, analog to digital converter 110 can continuously provide a digital output to accumulator 112. The digital outputs provided by analog to digital converter 110 over a given time period can be summed and maintained in accumulator 112. For example, accumulator 112 can include one or more registers and one or more adders. As also shown in FIG. 1, the output of accumulator 112 is provided to processor 104. Thus, processor 104 can receive the sum maintained in accumulator 112 to determine the total charge consumed by electronic device 106 and to then use the total charge consumed to determine the charge remaining in power source 108. However, power gauge 102 can consume a substantial amount of power from power source 108 since, for example, analog to digital converter 110 and accumulator 112 in conventional power gauge 102 must remain continuously on to accurately measure the charges consumed from power source 108.

Figure 2:
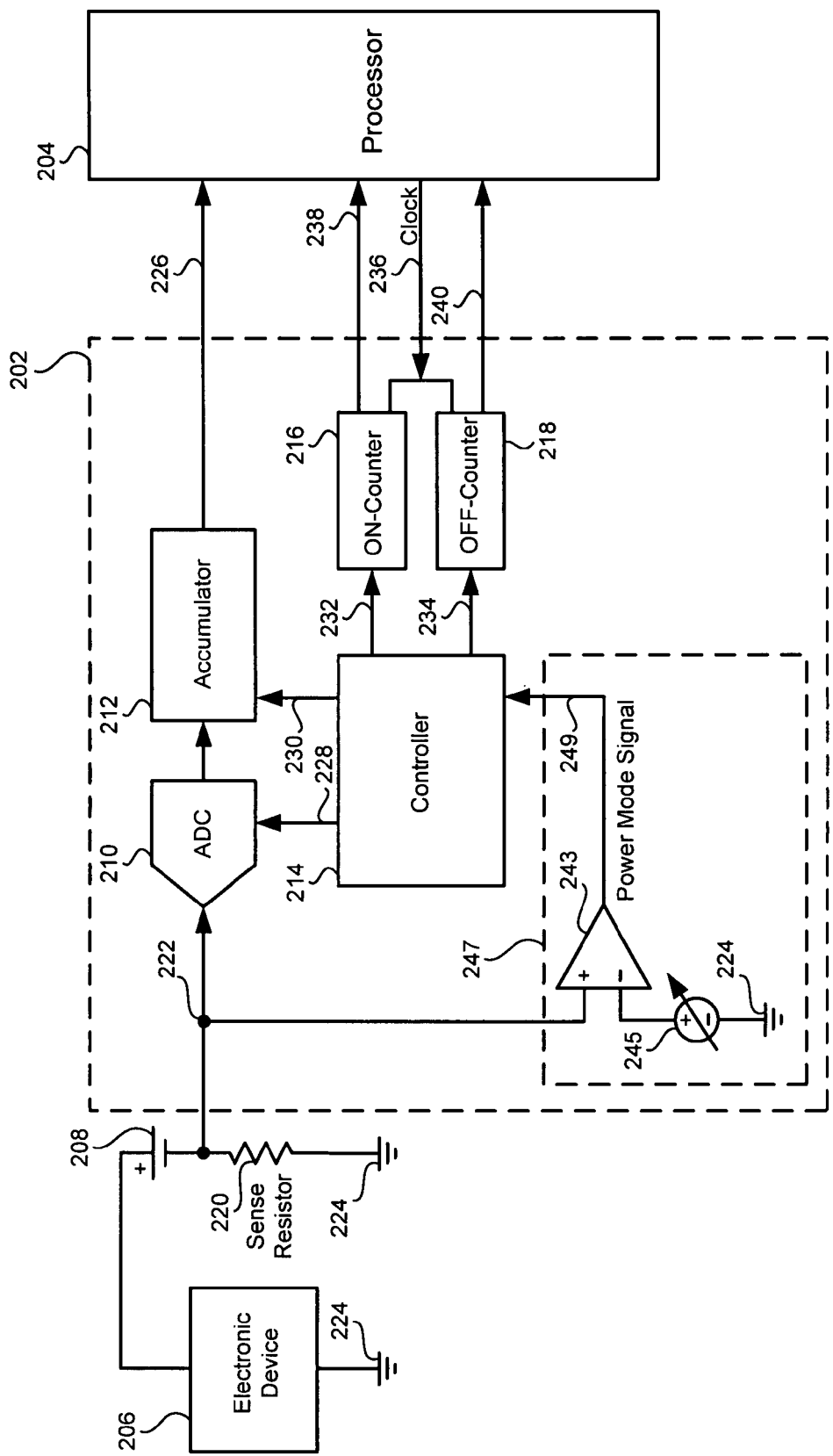
FIG. 2 shows an auto-synchronous power gauge for determining total charge consumed from a power source in an electronic device in accordance with one embodiment of the present invention.

FIG. 2 shows an auto-synchronous power gauge coupled to a processor for determining total charge consumed from (and/or remaining in) a power source in an electronic device in accordance with one embodiment of the present invention (as stated above, the term "power gauge" as used in the present application is sometimes referred to as a "fuel gauge" or "gas gauge" in the industry.) FIG. 2 includes auto-synchronous power gauge 202, processor 204, electronic device 206, power source 208, and sense resistor 220. As shown in FIG. 2, auto-synchronous power gauge 202 includes analog to digital converter ("ADC") 210, accumulator 212, controller 214, ON-counter 216, OFF-counter 218, and power mode detector 247, which includes comparator 243.

In FIG. 2, electronic device 206 is coupled to the positive terminal of power source 208. As further shown in FIG. 2, the negative terminal of power source 208 is coupled to the first terminal of sense resistor 220 at node 222. The second terminal of sense resistor 220 and electronic device 206 are coupled to ground 224. Electronic device 206 can be, for example, a portable electronic device, such as a cellular telephone, a camera, a personal digital assistant, a lap top computer, a portable DVD or MP3 player or any other electronic device where an accurate and efficient power gauge with a very low power consumption is required. Power source 208 can be a battery that provides a DC voltage and current, for example. In one embodiment, processor 204 and auto-synchronous power gauge 202 can be included in electronic device 206.

Analog to digital converter 210 in auto-synchronous power gauge 202 can be configured to, for example, process a signal associated with current drawn from power source 208. In the embodiment shown in FIG. 2, the input of analog to digital converter 210 is coupled to the first terminal of sense resistor 220 at node 222. Analog to digital converter 210 can be, for example, any general purpose analog to digital converter or a sigma-delta analog to digital converter. As shown in FIG. 2, the output of analog to digital converter 210 is coupled to the input of accumulator 212. Accumulator 212 can include, for example, one or more registers and one or more adders. As also shown in FIG. 2, the output of accumulator 212 is coupled to processor 204 via bus 226.

As further shown in FIG. 2, analog to digital converter 210, accumulator 212, ON-counter 216, and OFF-counter 218 are each coupled to controller 214 via respective buses 228, 230, 232, and 234. Controller 214 can be, for example, a combinatorial logic circuit or a microcontroller, or any other type of controller. As shown in FIG. 2, ON-counter 216 and OFF-counter 218 are configured to receive a clock signal from processor 204 via bus 236. In other embodiments, the clock signal can be delivered via bus 236 from a source other than processor 204. As also shown in FIG. 2, the contents of ON-counter 216 and OFF-counter 218 can be read by processor 204 via buses 238 and 240, respectively. For example, ON-counter 216 and OFF-counter 218 can each be an up-counter circuit known in the art.

As further shown in FIG. 2, controller 214 is configured to receive a power mode signal from power mode detector 247 via bus 249. As shown in FIG. 2, the positive input of comparator 243 in power mode detector 247 is coupled to node 222, thereby allowing comparator 243 to receive the above-mentioned signal associated with current drawn from power source 208. The negative input of comparator 243 is coupled to reference voltage 245. For example, reference voltage 245 can be a predetermined DC threshold voltage. Comparator 243 can be, for example, a dedicated comparator or a general purpose operational amplifier configured to function as a comparator. In one embodiment, comparator 243 can be a Schmitt trigger comparator.

The power mode signal, for example, can be a digital signal which can toggle between a logic "1" and a logic "0." The power mode signal can be used by controller 214 to enable and disable auto-synchronous power gauge 202. For example, when the power mode signal received by controller 214 is a logic "1," controller 214 can be configured to enable analog to digital converter 210, accumulator 212, and ON-counter 216 via respective buses 228, 230, and 232, and to disable OFF-counter 218 via bus 234. Conversely, when the power mode signal received by controller 214 is a logic "0," controller 214 can be configured to disable analog to digital converter 210, accumulator 212, and ON-counter 216 via respective buses 228, 230, and 232, and to enable OFF-counter 218 via bus 234.

Figure 3:
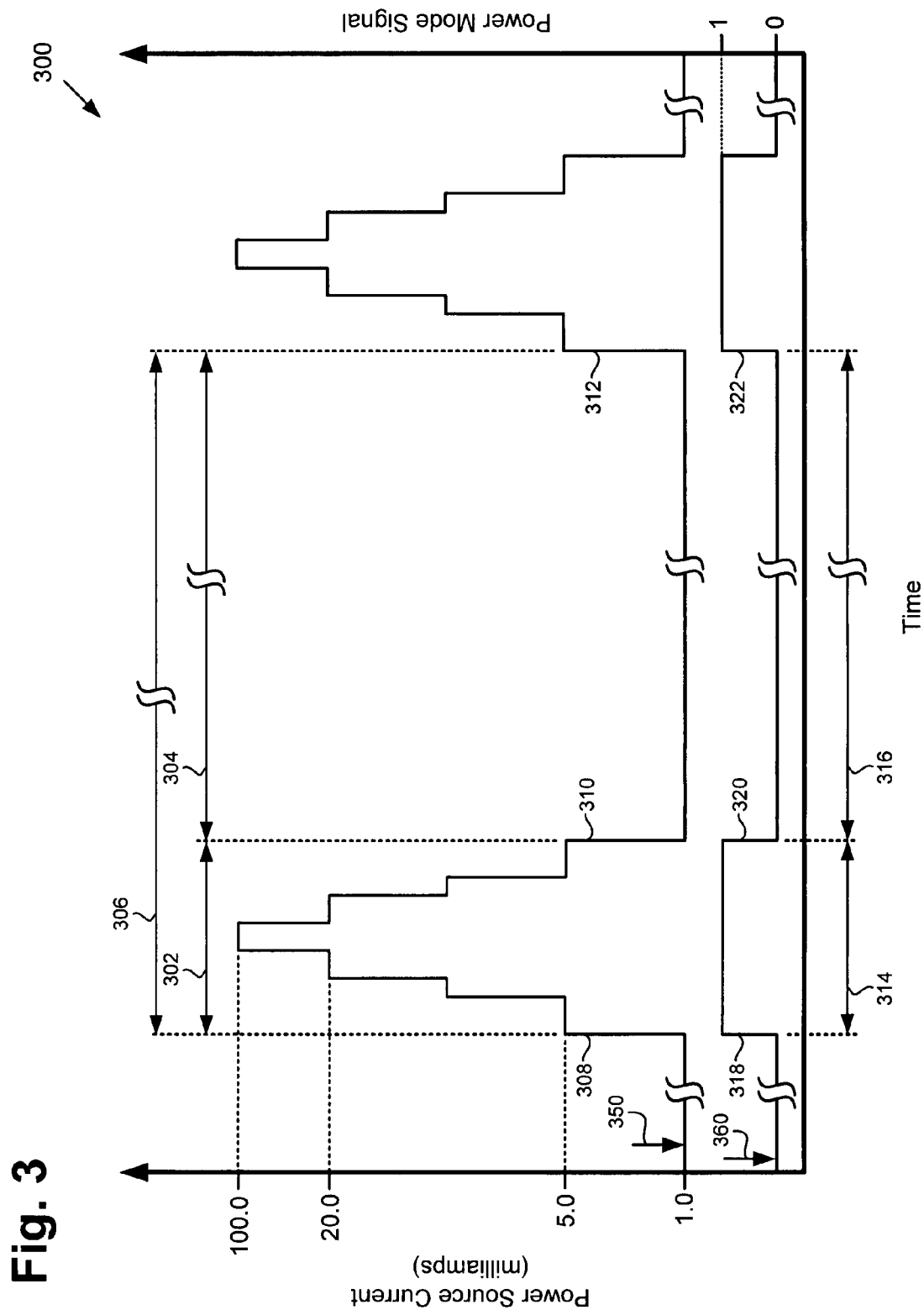
FIG. 3 shows a timing diagram representing an exemplary operation of an auto-synchronous power gauge in accordance with one embodiment of the invention.

The operation of auto-synchronous power gauge 202 will now be discussed with reference to timing diagram 300 shown in FIG. 3, which illustrates an exemplary operation of auto-synchronous power gauge 202. Timing diagram 300 includes power source current 350 and power mode signal 360, where power source current 350 is situated above power mode signal 360 for ease of illustration. As shown in FIG. 3, the y-axis labeled "Power Source Current" is associated with power source current 350 and the y-axis labeled "Power Mode Signal" is associated with power mode signal 360. As also shown in FIG. 3, the x-axis represents time. In FIG. 3, power source current 350 represents the amount of current drawn by electronic device 206 from power source 208 with respect to time, while power mode signal 360 represents the logic state, e.g., "0" or "1," of the power mode signal with respect to time.

By way of background, the current drawn by an electronic device, such as a cellular telephone, can vary significantly based on the electronic device's mode of operation. For example, when a cellular telephone is not in use and is not communicating with a base station, the current drawn by the cellular telephone from its battery may be minimal, e.g., approximately 1.0 milliamps, and thus the cellular telephone may be said to be operating in a low power mode. However, when the cellular telephone is in use or at times when the cellular telephone is not in use but is communicating with a base station, the current drawn by the electronic device from its battery may be substantially greater, e.g., approximately 20.0 to 100.0 milliamps, and thus the cellular telephone may be said to be operating in an operating power mode.

In FIG. 3, interval 302 represents the time period during which electronic device 206 is in an operating power mode and is defined by rising edge 308 and falling edge 310 of power source current 350. Interval 304 represents the time period during which electronic device 206 is in a low power mode and is defined by falling edge 310 and rising edge 312 of power source current 350. In the embodiment shown in FIG. 3, interval 302 is approximately 20.0 milliseconds while interval 304 is approximately 1.0 second. Thus, it should be noted that the duration of the low power mode might be as much as 50 times greater than the duration of the operating power mode in a typical electronic device. As shown in FIG. 3, intervals 302 and 304 may be repeated a number of times and thus to maintain brevity, only one complete period, e.g., interval 306, is shown in FIG. 3.

As further shown in FIG. 3, power mode signal 360 is a logic "1" during interval 314 and is a logic "0" during interval 316. As further shown in FIG. 3, interval 314 is defined by rising edge 318 of power mode signal 360, which occurs at approximately the same time as rising edge 308 of power source current 350, and falling edge 320 of power mode signal 360, which occurs at approximately the same time as falling edge 310 of power source current 350. As shown in FIG. 3, interval 316 is defined by falling edge 320 of power mode signal 360 and rising edge 322 of power mode signal 360, which occurs at approximately the same time as rising edge 312 of power source current 350. Thus, as shown in FIG. 3, power mode signal 360 is a logic "1" when electronic device 206 is in an operating power mode and is a logic "0" when electronic device 206 is in a low power mode. As such, the power mode signal of the invention can indicate the mode of operation of the electronic device, i.e., whether the electronic device is in an operating power mode or a low power mode.

When electronic device 206 in FIG. 2 is in an operating power mode, i.e., during interval 302 in FIG. 3, the electric current drawn by electronic device 206 from power source 208 generates a sense voltage across sense resistor 220 at node 222. As shown in FIG. 2, comparator 243 compares the sense voltage to reference voltage 245. Thus, if the sense voltage is greater than reference voltage 245, the output of comparator 243, i.e., the power mode signal, is toggled to a logic "1," thereby signaling controller 214 to enable analog to digital converter 210, accumulator 212, and ON-counter 216, and to disable OFF-counter 218. When analog to digital converter 210, accumulator 212, and ON-counter 216 are enabled, analog to digital converter 210 begins sampling the sense voltage generated across sense resistor 220 at node 222 and continuously generates a stream of digital outputs which are summed and stored in accumulator 212. At the same time, ON-counter 216 determines the time period over which the sum stored in accumulator 212 was acquired.

Thereafter, when electronic device 206 is in a low power mode, i.e., during interval 304, the electric current drawn by electronic device 206 from power source 208 drops to a minimal level, e.g., 1.0 milliamps, which causes the sense voltage at node 222 to drop to a minimal level. Comparator 243 compares the sense voltage to reference voltage 245 and if the sense voltage is below reference voltage 245, then the output of comparator 243, i.e., the power mode signal, is toggled to a logic "0," thereby signaling controller 214 to disable analog to digital converter 210, accumulator 212, and ON-counter 216, and to enable OFF-counter 218. When enabled, OFF-counter 218 determines the period over which analog to digital converter 210, accumulator 212, and ON-counter 216 were disabled.

Processor 204 can be configured to periodically read the values stored in accumulator 212, ON-counter 216, and OFF-counter 218 through respective buses 226, 238, and 240, and to thereafter clear the values stored in accumulator 212, ON-counter 216, and OFF-counter 218. In other embodiments, processor 204 may be configured to read the values stored in accumulator 212, ON-counter 216, and OFF-counter 218 before any of them overflows, without clearing their values. Thus, the values stored in accumulator 212, ON-counter 216, and OFF-counter 218 can then be used by processor 204 to determine the total charge consumed from power source 208 using techniques known in the art. Accordingly, once the total charge consumed from power source 208 is determined, the total charge remaining in power source 208 can also be determined.

Figure 4:
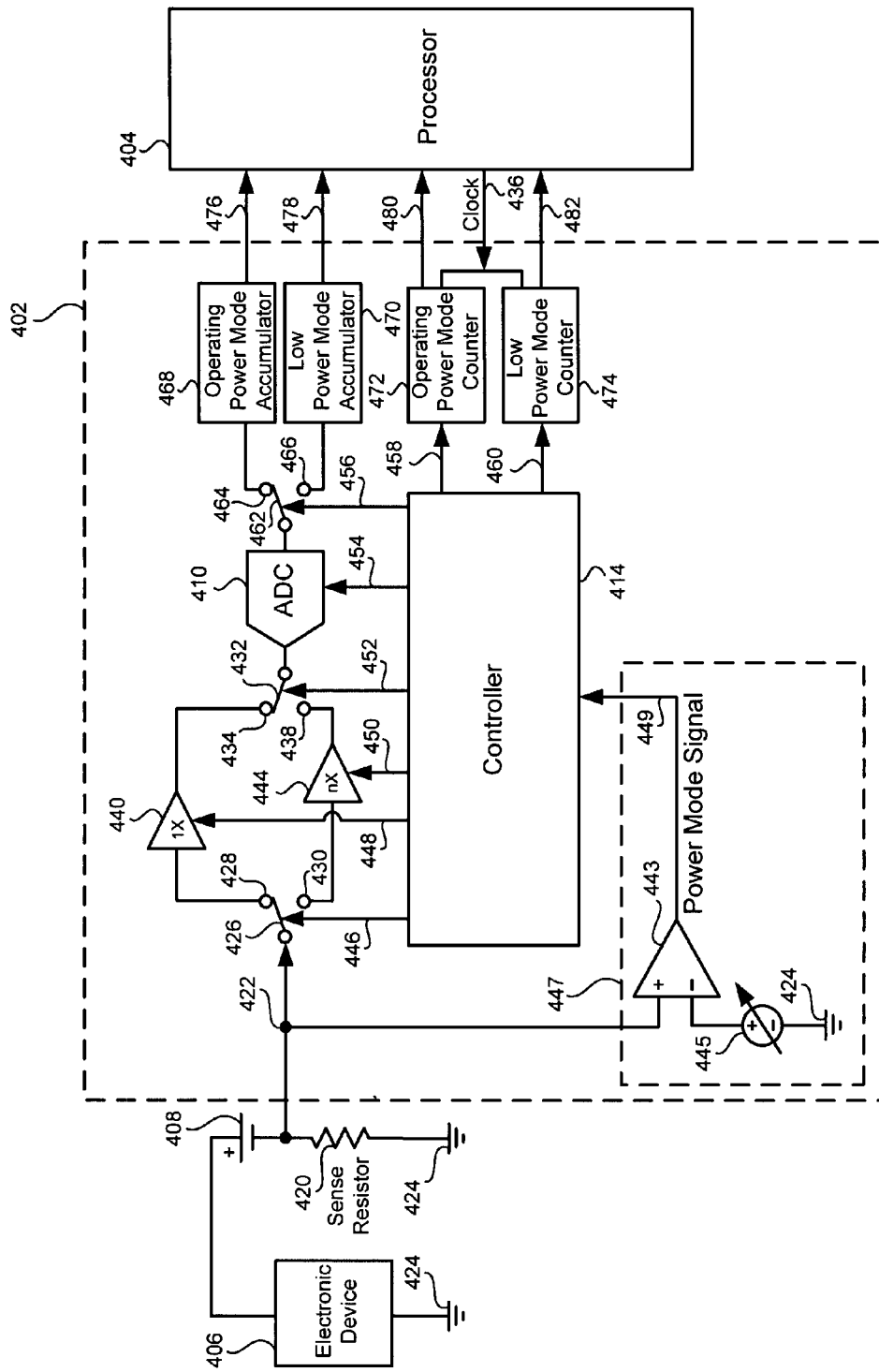
FIG. 4 shows an auto-synchronous power gauge for determining total charge consumed from a power source in an electronic device in accordance with one embodiment of the present invention.

FIG. 4 shows an auto-synchronous power gauge coupled to a processor for determining total charge consumed from a power source in an electronic device in accordance with one embodiment of the present invention. FIG. 4 includes auto-synchronous power gauge 402, processor 404, electronic device 406, and power source 408. As shown in FIG. 4, auto-synchronous power gauge 402 includes amplifiers 440 and 444, switches 426, 432, and 462, analog to digital converter 410, operating power mode accumulator 468 and low power mode accumulator 470, controller 414, operating power mode counter 472, and low power mode counter 474. Auto-synchronous power gauge 402 further includes power mode detector 447 which includes comparator 443 and reference voltage 445. In particular, processor 404, electronic device 406, power source 408, analog to digital converter 410, comparator 443, and reference voltage 445 in FIG. 4 correspond to processor 204, electronic device 206, power source 208, analog to digital converter 210, comparator 243, and reference voltage 245 in FIG. 2, respectively.

In FIG. 4, electronic device 406 is coupled to the positive terminal of power source 408. As shown in FIG. 4, the negative terminal of power source 408 is coupled to the first terminal of sense resistor 420 at node 422. As also shown in FIG. 4, the second terminal of sense resistor 420 and electronic device 406 are coupled to ground 424. In the embodiment shown in FIG. 4, switch 426 can be configured to provide a signal at node 422 to either the input of amplifier 440, e.g., when contacting terminal 428, or to the input of amplifier 444, e.g., when contacting terminal 430. As further shown in FIG. 4, switch 432 can be configured to provide the output of amplifier 440 to the input of analog to digital converter 410, e.g., when contacting terminal 434, or to provide the output of amplifier 444 to the input of analog to digital converter 410, e.g., when contacting terminal 438. As shown in FIG. 4, switch 462 can be configured to provide the output of analog to digital converter 410 to operating power mode accumulator 468, e.g., when contacting terminal 464, or to provide the output of analog to digital converter 410 to low power mode accumulator 470, e.g., when contacting terminal 466.

For example, operating power mode accumulator 468 and low power mode accumulator 470 can each be a register having a built-in adder. As also shown in FIG. 4, the output of operating power mode accumulator 468 and the output of low power mode accumulator 470 are coupled to processor 404 via respective buses 476 and 478. As further shown in FIG. 4, switches 426, 432, and 462, amplifiers 440 and 444, analog to digital converter 410, operating power mode counter 472, and low power mode counter 474 are each coupled to controller 414 via respective buses 446, 452, 456, 448, 450, 454, 458, and 460. Controller 414 can be, for example, a combinatorial logic circuit or a microcontroller, or any other type of controller. In the embodiment shown in FIG. 4, amplifier 440 may be a unity gain amplifier, whereas amplifier 444 may be a variable gain amplifier. For example, amplifier 444 may have a gain of 10.0 or 16.0.

As shown in FIG. 4, operating power mode counter 472 and low power mode counter 474 are configured to receive a clock signal from processor 404 via bus 436. In other embodiments, the clock signal can be delivered via bus 436 from a source other than processor 404. As also shown in FIG. 4, the contents of operating power mode counter 472 and low power mode counter 474 can be read by processor 404 via buses 480 and 482, respectively. For example, operating power mode counter 472 and low power mode counter 474 can each be an up-counter circuit known in the art.

As further shown in FIG. 4, controller 414 is configured to receive a power mode signal, e.g., power mode signal 360 shown in FIG. 3, from power mode detector 447 via bus 449. As shown in FIG. 4, the positive input of comparator 443 in power mode detector 447 is coupled to node 422, thereby allowing comparator 443 to receive a signal associated with current drawn from power source 408. The negative input of comparator 443 is coupled to reference voltage 445. For example, reference voltage 445 can be a predetermined DC threshold voltage. Thus, comparator 443 can be configured to compare the sense voltage at node 422 to reference voltage 445 and to generate the power mode signal provided to controller 414 in a manner similar to comparator 243 in FIG. 2 described above.

The operation of auto-synchronous power gauge 402 will now be discussed with reference to timing diagram 300 shown in FIG. 3. When electronic device 406 is in an operating power mode, e.g., during interval 302, power mode signal 360 is toggled to a logic "1," thereby signaling controller 414 to enable amplifier 440, analog to digital converter 410, and operating power mode counter 472 via buses 448, 454, and 458, respectively, and to disable low power mode counter 474 via bus 460. Controller 414 also configures switches 426, 432, and 462 to contact terminals 428, 434, and 464, respectively. Thus, during interval 302, analog to digital converter 410 samples node 422 through amplifier 440 and generates a number of digital outputs which are summed and stored in operating power mode accumulator 468. At the same time, operating power mode counter 472 determines the time period over which the sum stored in operating power mode accumulator 468 was acquired.

Thereafter, when electronic device 406 is operating in a low power mode, i.e., during interval 304, power mode signal 360 is toggled to a logic "0," thereby signaling controller 414 to disable amplifier 440 and operating power mode counter 472, and to enable amplifier 444 and low power mode counter 474. Controller 414 also configures switches 426, 432, and 462 to contact terminals 430, 438, and 466, respectively. Thus, during interval 304, analog to digital converter 410 samples node 422 through amplifier 444 and generates a number of digital outputs which are summed and stored in low power mode accumulator 470. At the same time, low power mode counter 474 determines the time period over which the sum stored in low power mode accumulator 470 was acquired. Thus, since the current drawn by electronic device 406 when in a low power mode, e.g., approximately 1.0 mA, is significantly lower than when in an operating power mode, e.g., approximately between 20.0 mA to 100.0 mA, amplifier 444 provides the requisite amplification to allow analog to digital converter 410 to accurately process the correspondingly low voltage samples acquired at node 422. Accordingly, the "amplified" digital outputs generated by analog to digital converter 410 are accumulated and stored separately in low power mode accumulator 470.

Processor 404 can be configured to periodically read the values stored in operating power mode accumulator 468, low power mode accumulator 470, operating power mode counter 472, and low power mode counter 474, and to thereafter clear the values stored in operating power mode accumulator 468, low power mode accumulator 470, operating power mode counter 472, and low power mode counter 474. In other embodiments, processor 404 may be configured to read the values stored in operating power mode accumulator 468, low power mode accumulator 470, operating power mode counter 472, and low power mode counter 474 before any of them overflows, without clearing their values. Thus, the values stored in operating power mode accumulator 468, low power mode accumulator 470, operating power mode counter 472, and low power mode counter 474 can be used by processor 404 to determine the total charge consumed from power source 408 using techniques known in the art. Accordingly, once the total charge consumed from power source 408 is determined, the total charge remaining in power source 408 can also be determined.

Figure 5:
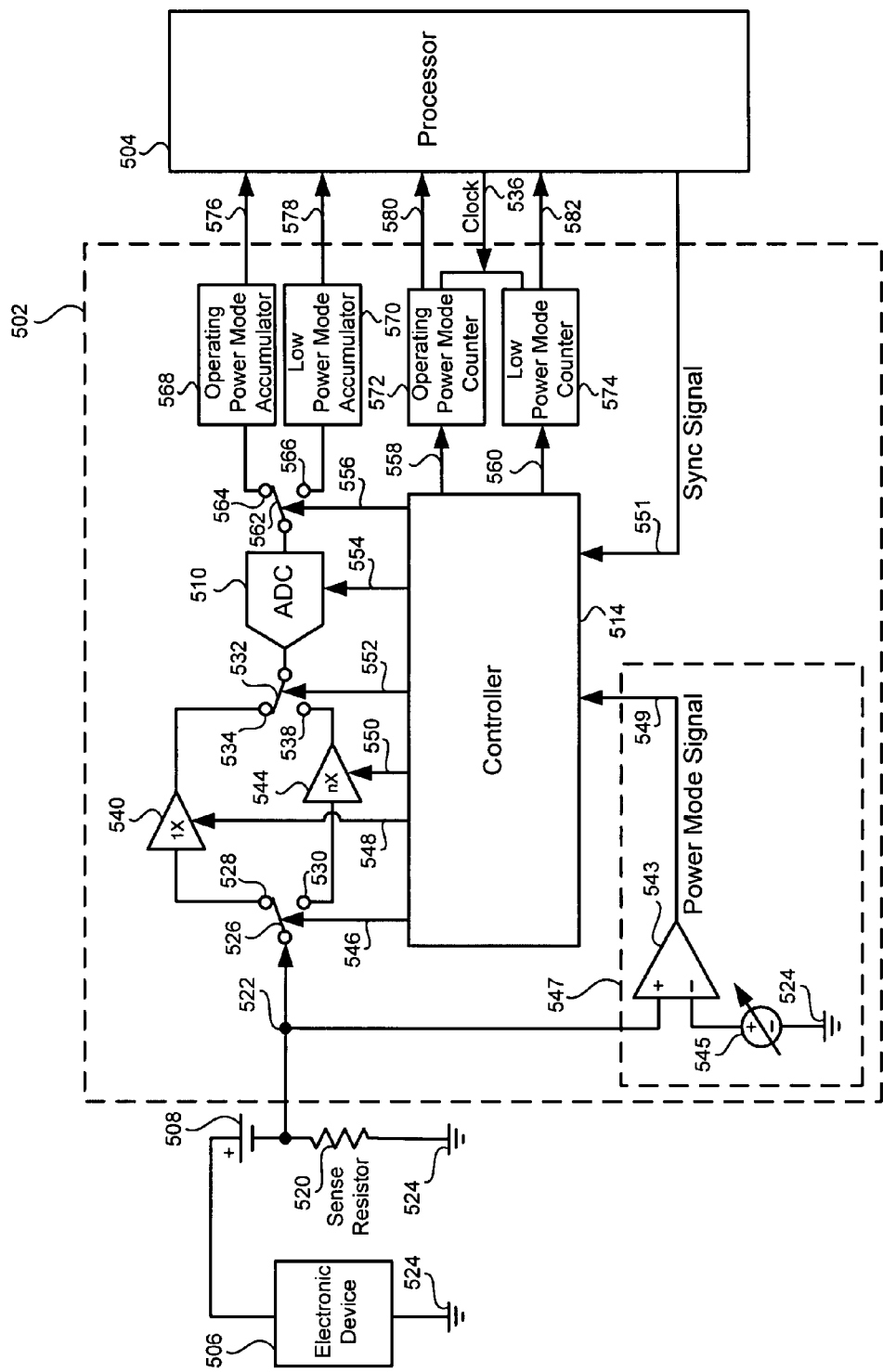
FIG. 5 shows an auto-synchronous power gauge for determining total charge consumed from a power source in an electronic device in accordance with one embodiment of the present invention.

FIG. 5 shows an auto-synchronous power gauge coupled to a processor for determining total charge consumed from a power source in an electronic device in accordance with one embodiment of the present invention. FIG. 5 includes auto-synchronous power gauge 502, processor 504, electronic device 506, and power source 508. As shown in FIG. 5, auto-synchronous power gauge 502 includes amplifiers 540 and 544, switches 526, 532, and 562, analog to digital converter 510, operating power mode accumulator 568 and low power mode accumulator 570, controller 514, operating power mode counter 572, and low power mode counter 574. Auto-synchronous power gauge 502 further includes power mode detector 547 which includes comparator 543 and reference voltage 545. In particular, processor 504, electronic device 506, power source 508, amplifiers 540 and 544, switches 526, 532, and 562, analog to digital converter 510, operating power mode accumulator 568, low power mode accumulator 570, controller 514, operating power mode counter 572, low power mode counter 574, comparator 543, and reference voltage 545 correspond to processor 404, electronic device 406, power source 408, amplifiers 440 and 444, switches 426, 432, and 462, analog to digital converter 410, operating power mode accumulator 468, low power mode accumulator 470, controller 414, operating power mode counter 472, low power mode counter 474, comparator 443, and reference voltage 445, respectively.

In the embodiment of the invention shown in FIG. 5, controller 514 is configured to receive a synchronization signal (also referred to as "sync signal") via bus 551 in addition to the power mode signal received via bus 549. The sync signal can be, for example, a digital signal which can toggle between a logic "1" and a logic "0." In one embodiment, the sync signal can be used by processor 504 to disable auto-synchronous power gauge 502 each time electronic device 506 operates in a low power mode. For example, processor 504 can toggle the sync signal immediately before electronic device 506 enters a low power mode of operation to cause controller 514 to disable auto-synchronous power gauge 502. Thus, auto-synchronous power gauge 502 can be enabled each time electronic device 506 operates in an operating power mode using the power mode signal and disabled each time the electronic device is operating in a low power mode using the sync signal.

The auto-synchronous power gauge of the invention provides significant advantages over the conventional power gauge shown in FIG. 1. In particular, by using a power mode signal to synchronize the operation of auto-synchronous power gauge 202 in FIG. 2 with the operating power mode of electronic device 206, the invention effectively reduces power consumption by a factor between 20 to 100, or even up to a factor of 1500 in certain embodiments. For example, as shown in FIG. 3, the invention enables auto-synchronous power gauge 202 during interval 302, e.g., for approximately 20.0 ms, when the current drawn by electronic device 206 might be as high as 20.0 mA to 100.0 mA and disables auto-synchronous power gauge 202 during interval 304, e.g., for approximately 1.0 s, when the current drawn by electronic device 206 might be as low as 1.0 mA. Thus, in contrast to the conventional power gauge in FIG. 1, which remains continuously enabled, auto-synchronous power gauge 202 is enabled for only 1.0% to 5.0% of the time, thereby providing substantial power savings.

Since the auto-synchronous power gauge of the invention is enabled by a power mode signal which is associated with the amount of current drawn by the electronic device, the operation of the auto-synchronous power gauge can be accurately synchronized with the operating power mode of the electronic device. Moreover, the embodiment of the invention shown in FIG. 5 advantageously allows processor 504 to disable auto-synchronous power gauge 502 using a sync signal at any time, such as immediately before electronic device 506 enters a low power mode of operation.

The embodiments of the invention shown in FIGS. 4 and 5, also provide higher accuracy than the conventional power gauge in FIG. 1 while consuming less power and maintaining cost effectiveness. More specifically, by using a separate amplifier, e.g. amplifier 444 in FIG. 4 (or amplifier 544 in FIG. 5), to adequately amplify the low voltage signals generated at node 422 (or node 522) when electronic device 406 (or electronic device 506) is in a low power mode, analog to digital converter 410 (or analog to digital converter 510) is not required to have a high resolution in order to generate accurate digital outputs. As such, the invention avoids the need for a high resolution analog to digital converter, which can provide substantial power savings while reducing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an auto-synchronous power gauge has been described.

The invention claimed is:

1. An auto-synchronous power gauge for measuring charge consumed by an electronic device, said auto-synchronous power gauge comprising:
an analog to digital converter to produce digital outputs corresponding to a current drawn by said electronic device;
an accumulator to receive and process said digital outputs;
a power mode detector configured to disable said accumulator in response to said current drawn by said electronic device dropping to a level corresponding to a low power mode;
wherein said accumulator indicates said charge consumed by said electronic device.

2. The auto-synchronous power gauge of claim 1 wherein said power mode detector disables said analog to digital converter when said electronic device is in said low power mode.

3. The auto-synchronous power gauge of claim 1 wherein said power mode detector enables said accumulator when said electronic device is in an operating power mode.

4. The auto-synchronous power gauge of claim 1 wherein said power mode detector enables said analog to digital converter when said electronic device is in an operating power mode.

5. The auto-synchronous power gauge of claim 1 further comprising a controller configured to receive a power mode signal from said power mode detector to disable said accumulator when said electronic device is operating in said low power mode.

6. The auto-synchronous power gauge of claim 1 further comprising a controller configured to receive a power mode signal from said power mode detector to disable said analog to digital converter when said electronic device is operating in said low power mode.

7. The auto-synchronous power gauge of claim 3 further comprising an ON-counter and an OFF-counter, said ON-counter and OFF-counter being used to determine a time period corresponding to said operating power mode and said low power mode.

8. The auto-synchronous power gauge of claim 1, wherein a processor uses said charge consumed by said electronic device to determine a charge remaining in a power source for said electronic device.

9. The auto-synchronous power gauge of claim 1, wherein said power mode detector is configured to generate a power mode signal associated with a current drawn by said electronic device from a power source for said electronic device.

10. The auto-synchronous power gauge of claim 4 further comprising an ON-counter and an OFF-counter, said ON-counter and OFF-counter being used to determine a time period corresponding to said operating power mode and said low power mode.

11. The auto-synchronous power gauge of claim 8, wherein said power source is a battery.

12. The auto-synchronous power gauge of claim 9, wherein said power mode detector includes a comparator configured to compare a voltage corresponding to said current drawn by said electronic device to a predetermined reference voltage to generate said power mode signal.

* * * * *